United States Patent
Yamaguchi (10) Patent No.: US 6,878,211 B2
(45) Date of Patent: Apr. 12, 2005

(54) SUPPORTING STRUCTURE FOR A CERAMIC SUSCEPTOR

(75) Inventor: Shinji Yamaguchi, Aichi Pref. (JP)

(73) Assignee: NGK Insulators, Ltd., Nagoya (JP)

( * ) Notice: Subject to any disclaimer, the term of this patent is extended or adjusted under 35 U.S.C. 154(b) by 132 days.

(21) Appl. No.: 10/105,881

(22) Filed: Mar. 25, 2002

(65) Prior Publication Data

US 2002/0144787 A1 Oct. 10, 2002

(30) Foreign Application Priority Data

Mar. 30, 2001 (JP) ........................................ 2001-098695

(51) Int. Cl.[7] .......................... H01L 21/00; C23C 16/00
(52) U.S. Cl. ........................ 118/728; 118/725; 118/500; 156/345.51; 156/345.52; 361/234; 219/444.1; 219/544; 392/416; 392/418
(58) Field of Search ................................. 118/728, 725, 118/500; 156/345.51, 345.52; 361/234; 219/444.1, 544; 392/416, 418

(56) References Cited

U.S. PATENT DOCUMENTS

| | | | |
|---|---|---|---|
| 5,484,486 A | * | 1/1996 | Blackburn et al. .......... 118/728 |
| 5,522,937 A | | 6/1996 | Chew et al. |
| 6,035,101 A | * | 3/2000 | Sajoto et al. ................ 392/416 |
| 6,066,836 A | * | 5/2000 | Chen et al. .................. 219/390 |
| 6,213,478 B1 | * | 4/2001 | Nishikawa .................. 279/4.08 |
| 6,589,352 B1 | | 7/2003 | Yudovsky et al. |

FOREIGN PATENT DOCUMENTS

| | | | | |
|---|---|---|---|---|
| JP | 59232994 A | * | 12/1984 | ........... C30B/25/12 |
| KR | 2001-0062301 | | 7/2001 | |

* cited by examiner

*Primary Examiner*—Gregory Mills
*Assistant Examiner*—Ram N. Kackar
(74) *Attorney, Agent, or Firm*—Burr & Brown (57) ABSTRACT

A supporting structure for attaching a ceramic susceptor into a processing chamber is provided. The ceramic susceptor is used for placing and heating an article to be processed. The supporting structure has one or more supporting projections integrally provided on a back face of the ceramic susceptor and one or more supporting members mounted to the processing chamber and separated from the supporting projections. At least a part of the supporting member is made from a heat-insulating material and the supporting projection is attached to the supporting member by mechanical means.

8 Claims, 8 Drawing Sheets

SUPPORTING STRUCTURE FOR A CERAMIC SUSCEPTOR

BACKGROUND OF THE INVENTION

1. Field of the Invention

The present invention relates to a supporting structure for attaching a ceramic susceptor, on which an article to be processed is placed and heated, into a processing chamber.

2. Description of the Related Art

Figure 1:
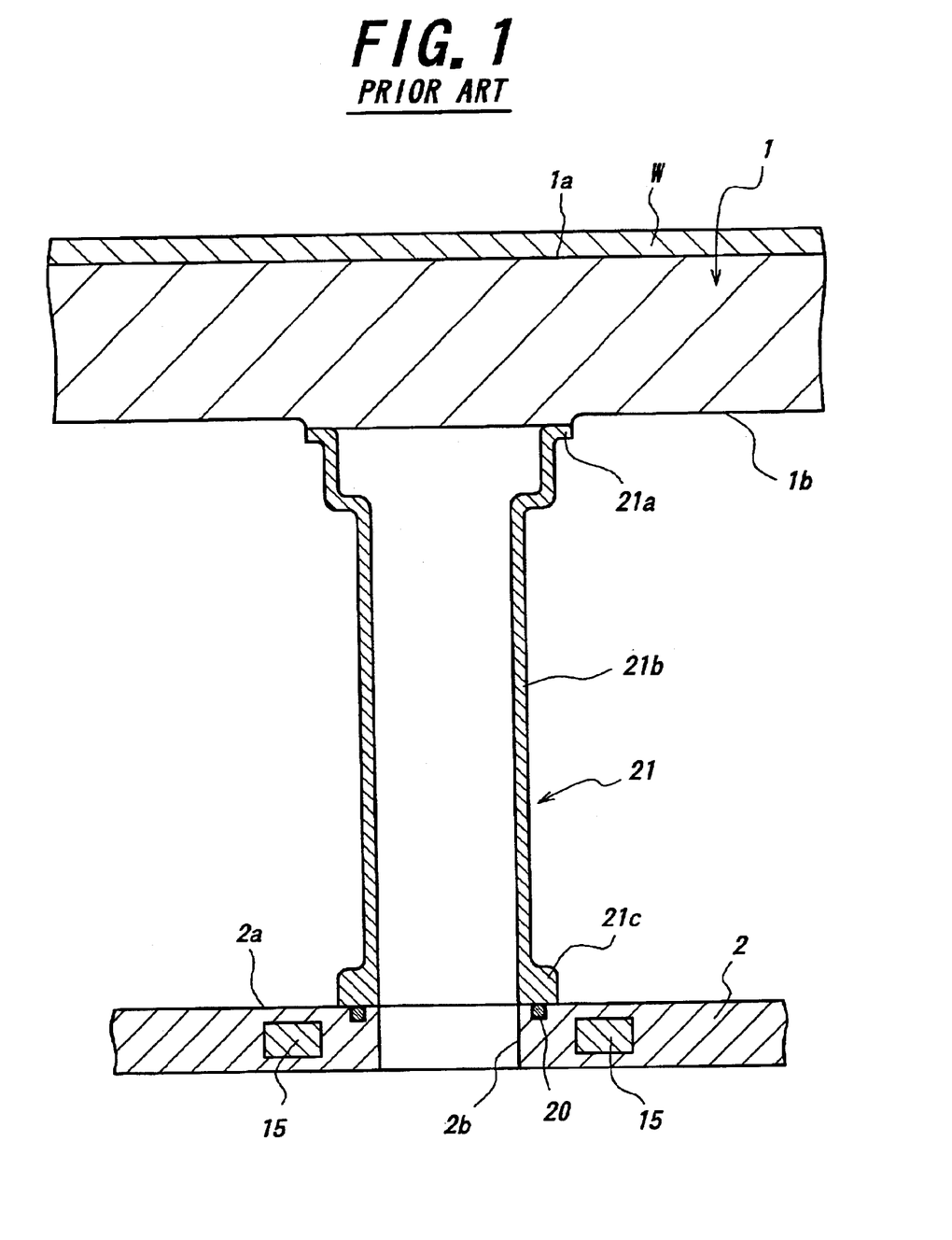
FIG. 1 is a cross sectional view schematically showing a prior art structure for attaching the ceramic susceptor 1 to the chamber 2.

For a semiconductor-producing application, a ceramic susceptor 1 needs to be attached to an inner wall 2a of a chamber 2, for example, as shown in FIG. 1. For this purpose, one terminal end 21a of a tubular supporting member 21 made of a ceramic plate is attached to a back face 1b of the susceptor 1, and the other terminal end 21c of the supporting member 21 is attached to the inner wall 2a of the chamber 2. The supporting member 21 is made of heat-resistant ceramics such as alumina or aluminum nitride. An inner space of the supporting member 21 is communicated with an opening 2b of the chamber 2. An O-ring 20 effects a hermetical seal between the supporting member 21 and the chamber 2.

The temperature of a surface 1a for setting/heating a semiconductor wafer W of the susceptor 1 may reach, for example, 400° C. or more, and in some cases 600° C. or more, while a rubber sealing member 20 such as the O-ring cannot be tolerant of high temperature. The heat resistant temperature of the rubber sealing member is generally about 200° C. Therefore, the temperature near the O-ring is preferably controlled at not more than 200° C. by providing a cooling flange 15 in the chamber to cool a circumference of the O-ring.

However, when the temperature of the susceptor rises as mentioned above and the temperature of the one terminal end 21a of the supporting member 21 exceeds, for example, 400° C. while the temperature of the other terminal end 21c of the supporting member 21 is cooled down to not more than 200° C., a temperature gradient in the supporting member is 200° C. or more.

In order to improve joining strength of the supporting member 21 to the susceptor 1, and to provide a gas hole and a through-hole for terminals and a thermocouple in a wall of the supporting member 21, the wall of the supporting member 21 needs to be thick to enlarge a joining area of the supporting member to the susceptor. However, when the wall of the supporting member is thick, the larger temperature gradient occurs in the supporting member as mentioned in the above, which results in an increased amount of heat propagating through the supporting member 21. As a result, a cold spot occurs on the heating surface 1a due to the increased heat conduction from a vicinity of a joining portion 21a of the supporting member 21. From this viewpoint, it is useful that a body portion of the supporting member 21 is made thin, and an expanding portion (flange portion) 21a having a large thickness is provided at an end portion of the supporting member 21 on a susceptor side terminal.

However, if the flange portion 21a is provided at the end portion of the supporting member 21, inner stress which concentrates in a vicinity of a boundary between the tubular body portion 21b and the flange portion 21a of the supporting member tends to excessively increase when the susceptor is heated to a high temperature. Particularly, since a vicinity of the flange portion 21a has a bended shape as shown in FIG. 1, thermal stress tends to concentrate on the bended portion.

SUMMARY OF THE INVENTION

It is therefore an object of the present invention to provide a supporting structure for attaching a ceramic susceptor into a processing chamber, which ceramic susceptor has a setting surface for placing and heating an article to be processed, wherein an amount of heat escaping from the ceramic susceptor to the chamber through a supporting member is reduced as much as possible during the heating to suppress occurrence of cold spots and to decrease thermal stress at a joining portion between the ceramic susceptor and the supporting member, so that strain, misalignment and breakage at the joining portion can be prevented.

The present invention relates to a supporting structure for attaching a ceramic susceptor into a processing chamber, which ceramic susceptor has a setting surface for placing an article to be processed and being subjected to temperature changes, the supporting structure comprising a supporting projection to be integrally provided on a surface opposed to the setting surface of the susceptor, and a supporting member to be mounted to the processing chamber and separated from the supporting projection, wherein at least a part of the supporting member is made of a heat-insulating material and the supporting projection is attached to the supporting member by a mechanical means.

According to the present invention, the supporting projection is integrally provided on the back face of the ceramic susceptor and mechanically attached to the separated supporting member which is not directly joined with the ceramic susceptor. At least a part of the supporting member is made of the heat-insulating material. As a result, even if the ceramic susceptor is thermally expanded during the heating, since the supporting portion is separated from the ceramic susceptor and the supporting projection and only mechanically engaged with the supporting projection, the thermal stress is not directly applied on an engaging portion between the supporting projection and the supporting member, so that a deformation of the supporting projection can be absorbed by a deformation or displacement of the mechanical joint means. Thus, the thermal stress at the joining portion between the ceramic susceptor and the supporting member can be reduced to prevent the joining portion from being strained, displaced and broken. In addition, at least a part of the supporting member is made of the heat-insulating material to decrease the amount of heat escaping from the ceramic susceptor to the processing chamber through the supporting member, so that the occurrence of the cold spots can be prevented. Moreover, although the ceramic susceptor is mechanically fixed, a fixing member (mainly a metallic member) is not exposed on a side of the setting surface of the susceptor for placing an article to be processed.

BRIEF DESCRIPTION OF THE DRAWINGS

For a better understanding of the invention, reference is made to the accompanying drawings, wherein.

DETAILED DESCRIPTION OF THE INVENTION

A method for forming a supporting projection on a ceramic susceptor is not particularly limited. For example, the supporting projection may be formed by grinding the rest of the back face of the ceramic susceptor. In this case, the supporting projection and the ceramic susceptor have a continuous ceramic structure therebetween.

The ceramic susceptor and the supporting member may also be separately formed, and then integrally joined to each other. The method for joining the ceramic susceptor and the supporting member is not particularly limited, but they can be joined, for example, by brazing. Alternatively, they can be joined by a solid phase joining or a solid-liquid phase joining as disclosed in JP-A-8-073,280. The maximum temperature of the heating surface of the susceptor reaches, for example, 400° C. or more, and, in some cases, 600° C. or more, but 1200° C. or less.

A material of the ceramic susceptor is not limited, but nitride ceramic materials such as silicon nitride, sialon and aluminum nitride; aluminum-based ceramic materials such as alumina and aluminum nitride; silicon carbide; nitrides of rare earth-elements; oxides of rare earth-elements; and the like may be recited by way of example. The material is preferably a ceramic material having a corrosion resistance against a halogen-based corrosive gas, more preferably aluminum nitride or dense alumina, and most preferably an aluminum nitride-based ceramic materials or alumina having a relative density of at least 95%.

A material of the supporting projection may be that of the ceramic susceptor as recited in the above. The material of the supporting projection may also be a non-ceramic material including a hard inorganic material such as an amorphous inorganic material, a glass or a crystallized glass.

The ceramic susceptor is heated by a heat source which is not particularly limited. The ceramic susceptor may include both a susceptor to be heated by an external heat source (e.g. an infrared lamp) and a susceptor to be heated by an internal heat source (e.g. a heater embedded in the susceptor). Functional components such as a resistance-heating element, an electrostatically chucking electrode and a plasma-generating electrode may be embedded in the susceptor.

The heat-insulating material is not particularly limited, but a material having a thermal conductivity of 35 W/m·K or less, more preferably a material having a thermal conductivity of 15 W/m·K or less is particularly preferred. Suitable examples of the heat-insulating material may be a Ni alloy such as a stainless steel, alumina, $Si_3N_4$, sialon, quartz, etc.

In a preferred embodiment, the supporting member comprises a heat-insulating member made of a heat-insulating material and a metallic member made of a metal. The material of the metallic member is not particularly limited, but aluminum, nickel, tantalum, a Ni alloy such as a stainless steel, platinum and a rare earth metal is preferred from the viewpoint of preventing contamination of semiconductors.

In a preferred embodiment, the supporting member has a tubular shape. In this case, strength as a structural body can be ensured while the cross sectional area of the supporting member is decreased to reduce a thermal conduction. In addition, wires and a thermocouple may run through the interior space of the supporting member, or they may be embedded in the wall of the supporting member.

The terms of "the supporting projection is attached to the supporting member by mechanical means" is intended to mean that they are not joined or bonded along a certain boundary by a chemical joining or bonding, but movably attached to each other by the mechanical means.

The mechanical means for attaching the supporting member and the supporting projection is not particularly limited.

Figure 2:
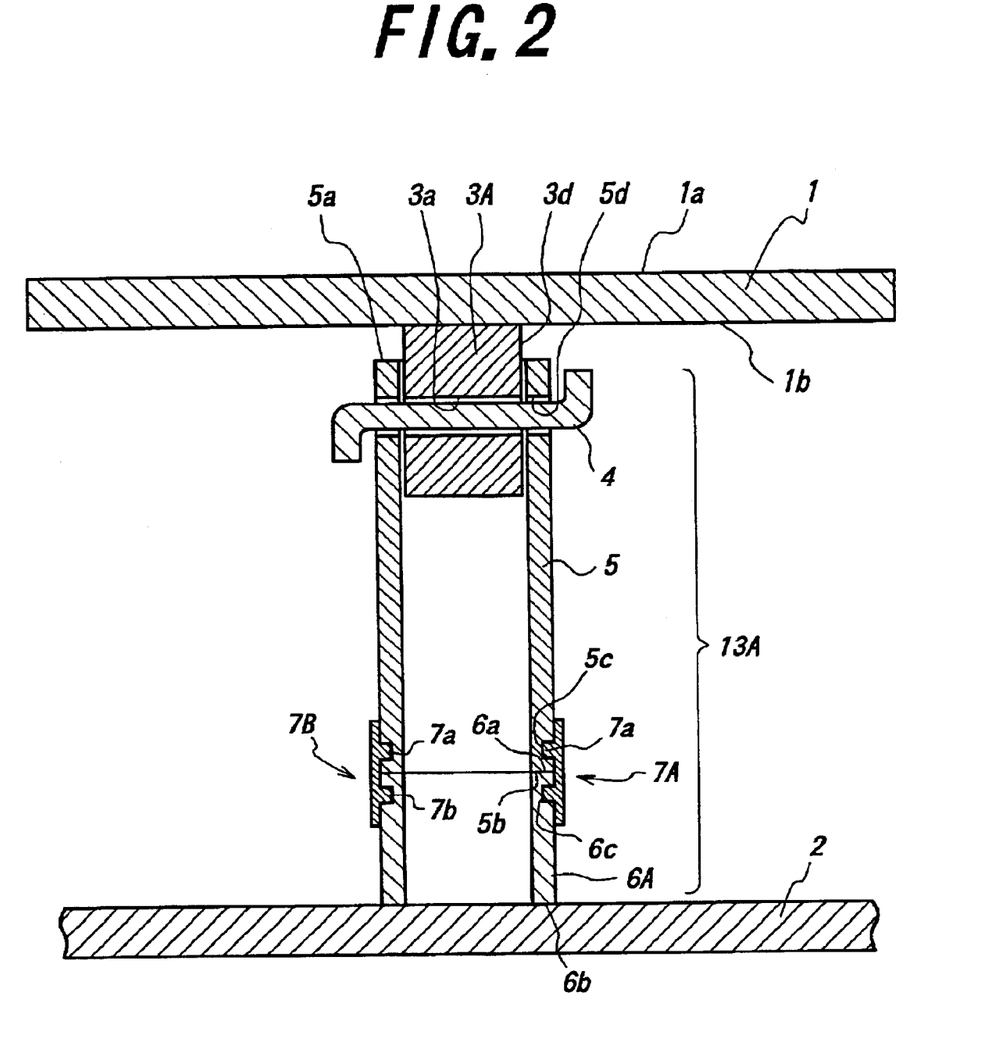
FIG. 2 is a cross sectional view schematically showing a supporting structure according to one embodiment of the present invention, in which an engaging member 4 is used as the mechanical means.
Figure 3A:
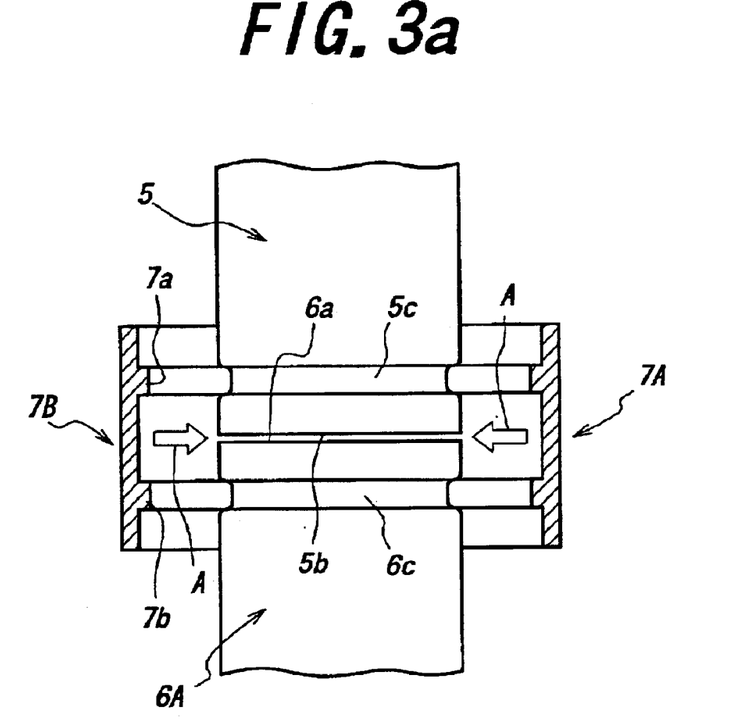
FIG. 3(a) is a front view of a joint portion between the metallic member 5 and the heat-insulating member 6A.
Figure 3B:
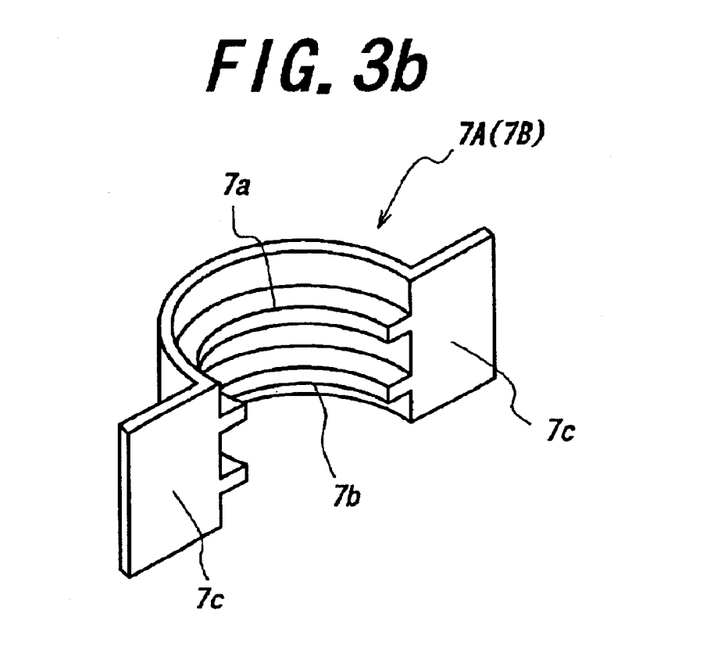
FIG. 3(b) is a perspective view showing holding members 7A and 7B.
Figure 4A:
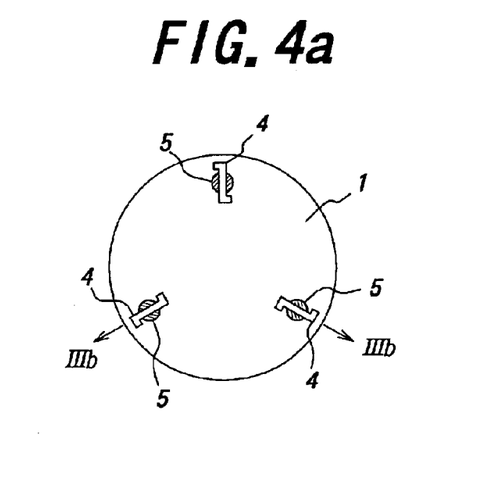
FIG. 4(a) shows a state in which supporting members are attached on the back face of the ceramic susceptor 1 at three places.
Figure 4B:
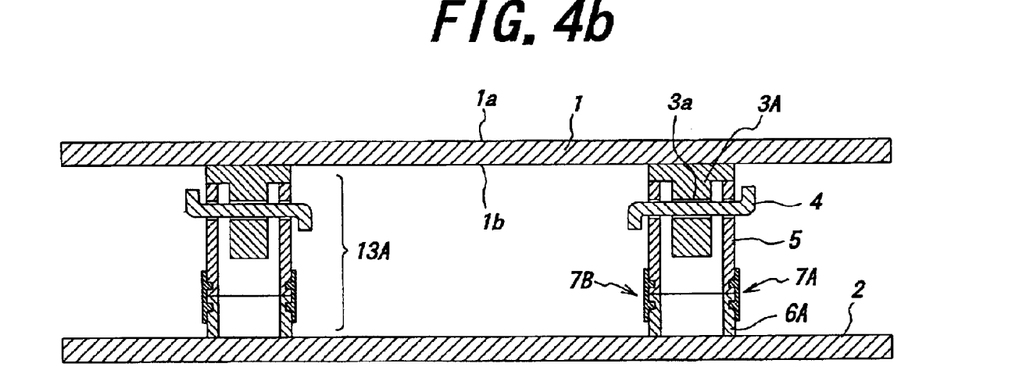
FIG. 4(b) is a cross sectional view taken along a line IIIb—IIIb of FIG. 3(a)

In a preferred embodiment, a through-hole is provided in each of the supporting projection and the supporting member to insert an engaging member into the through-holes. FIGS. 2–4 show this embodiment.

In FIG. 2, a supporting projection 3A is joined approximately at a center portion of a back face 1b of a ceramic susceptor 1. A through-hole 3a is formed in the supporting projection 3A approximately in a horizontal direction. A supporting member 13A is mounted on a chamber 2. The method for mounting the supporting member 13A to the chamber 2 is not limited. The supporting member 13A has a tubular shape, e.g. a cylindrical shape. The supporting member 13A comprises a metallic member 6A and a heat-insulating member 5. A through-hole 5d is formed on the heat-insulating member 5 at a portion near an upper end face 5a. An engaging member, for example, a pin 4 is inserted in the through-holes 3a and 5d, so that the supporting projection 3A is supported by the supporting member.

The form of the engaging member is not limited, but may be a round rod, a rectangular rod, a clip-like member or a clump-like member.

A lower end face 5b of the heat-insulating member 5 is abutted to an upper end face 6a of the metallic member 6A. A lower end face 6b of the metallic member 6A is proximate to chamber 2.

FIGS. 3(a) and 3(b) show a configuration of a joining portion between the metallic member 6A and the heat-insulating member 5. As shown in FIG. 3(a), a groove 5c is formed on an outer surface of a lower end portion of the heat-insulating member 5, and a groove 6c is formed on an outer surface of an upper end portion of the metallic member 6A.

FIG. 3(b) shows a holding member 7A (7B). A plurality of, for example, two holding members are used. Each holding member has curved slender bosses 7a and 7b, as well as a flange portion 7c for joining. End faces of the metallic member and the heat-insulating member are abutted to each other, and the metallic member and the heat-insulating member are covered with the holding members 7A and 7B from the outer surface side in the directions shown by arrows A in FIG. 3(a). The bosses 7a and 7b are inserted and fitted into the grooves 5c and 6c, respectively. Then, flange portions 7c of the holding members 7A and 7B are joined together.

In the embodiment of FIG. 2, only one supporting member according to the present invention is provided, but two or more supporting members may be provided. In an embodiment shown in FIG. 4, three supporting members are provided to support the susceptor 1 at three points. The configuration of each of the supporting members is the same as that shown in FIGS. 2 and 3. A pin 4 is inserted in each of three supporting members approximately in a diametrical direction, so that the thermal expansion can be compensated.

Figure 5:
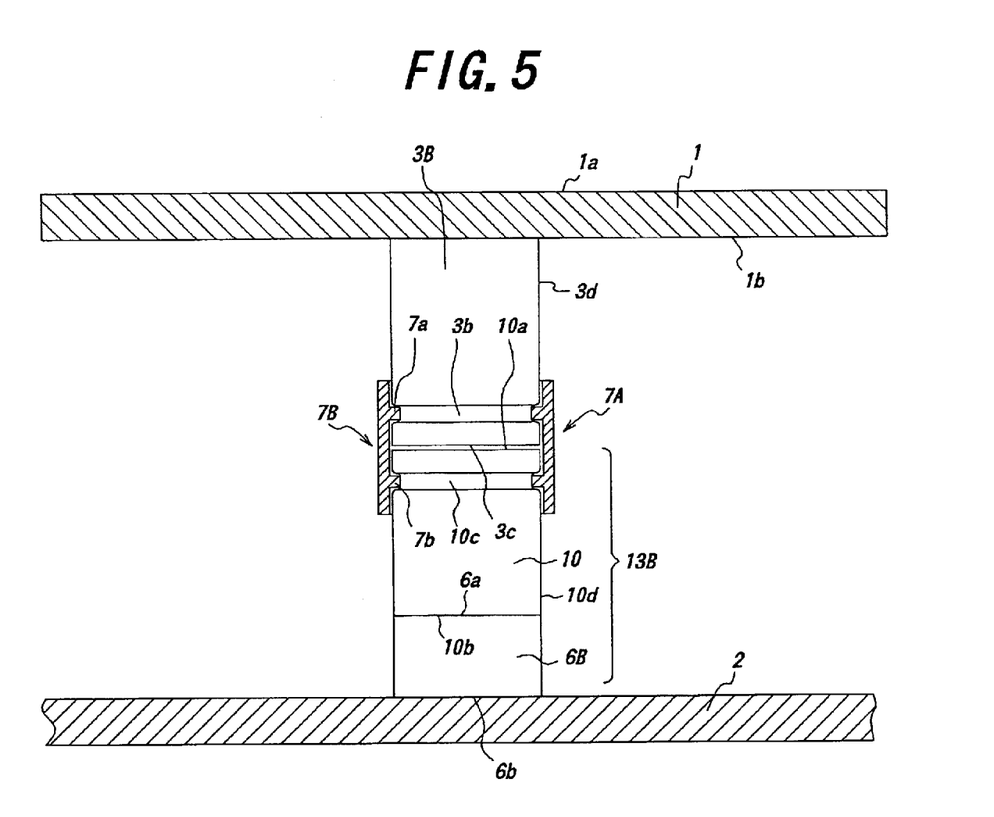
FIG. 5 is a cross sectional view schematically showing a supporting structure according to another embodiment of the present invention, in which holding members 7A and 7B are used as the mechanical means.

In a preferred embodiment, the supporting projection and the supporting member may be mechanically joined by holding outer walls of the supporting projection and the supporting member from the outside with the holding member. FIG. 5 shows this type of the embodiment.

A supporting projection 3B is provided on a back face 1b of a susceptor 1. The supporting projection 3B is supported by a supporting member 13B. The supporting member 13B comprises a heat-insulating member 10 and a metallic member 6B. Grooves 3b and 10c are provided on outer surfaces of a lower end portion of the supporting projection 3B and an upper end portion of the heat-insulating member 10, respectively.

The form of the holding member 7A(7B) is shown in FIG. 3(b). An end face 10a of the heat-insulating member 10 and an end face 3c of the supporting projection 3B are abutted to each other, and the supporting projection 3B and the heat-insulating member 10 are covered with the holding members 7A and 7B at outer wall faces 3d and 10d of the supporting projection 3B and the heat-insulating member 10, respectively. Bosses 7a and 7b are inserted and fitted into the grooves 3b and 10c, respectively. Then, flange portions 7c of the holding members 7A and 7B are joined together.

Figure 6A:
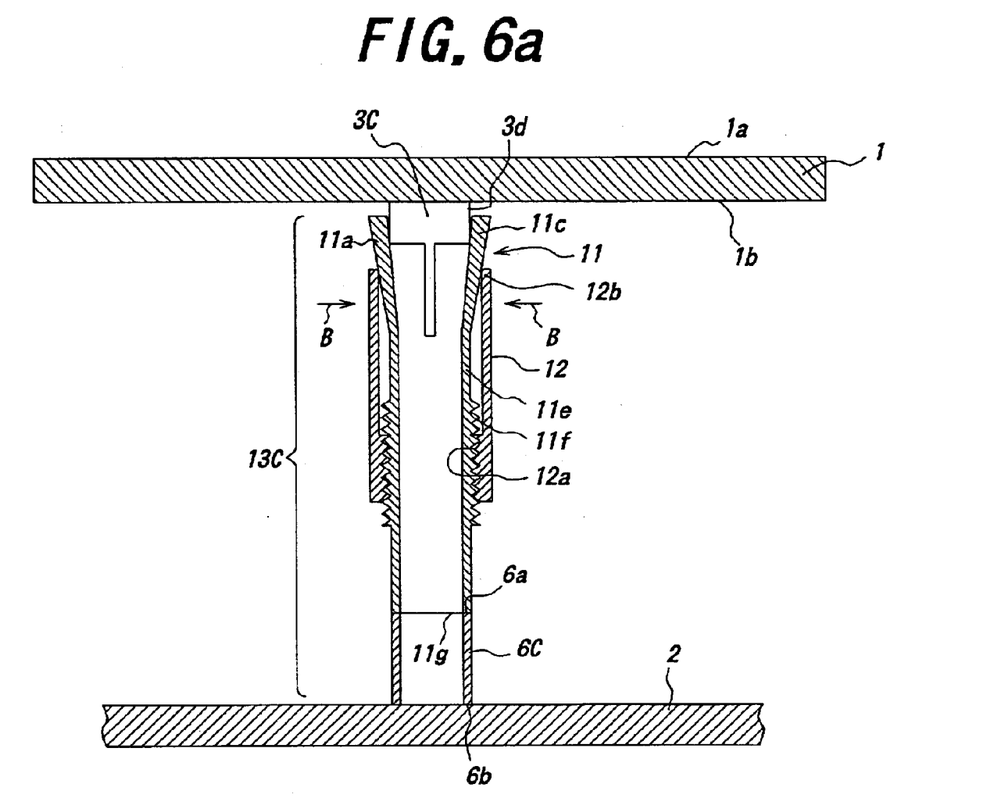
FIG. 6(a) is a sectional view schematically showing a supporting structure according to a further embodiment of the present invention, in which a pressing member 12 and pressing elements 11a–11d are used as the mechanical means.
Figure 6B:
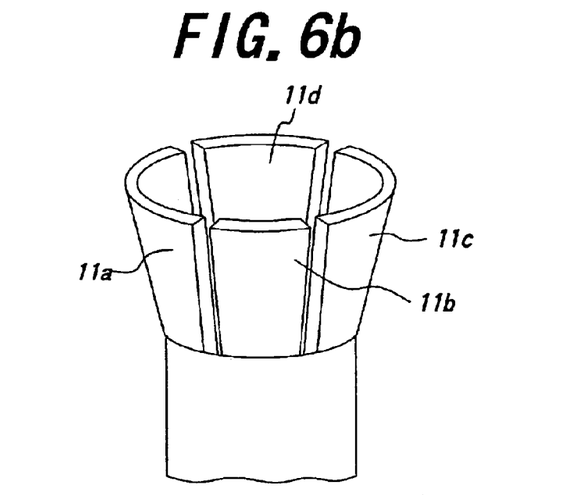
FIG. 6(b) shows the detail of the pressing elements.

In a preferred embodiment, the supporting projection is fixed to the supporting member by pressing the supporting member against the supporting projection. FIG. 6 shows this type of embodiment.

A supporting projection 3C is provided on a back face 1b of a susceptor 1. A supporting member 13C comprise a heat-insulating member 11 and a metallic member 6C. A method for joining the heat-insulating member 11 and the metallic member 6C is not limited, but the method as mentioned in the above may be used.

The heat-insulating member 11 has a body portion 11e having a tubular, preferably cylindrical shape, and pressing elements 11a, 11b, 11c and 11d provided on the body portion 11e. An end face 11g of the body portion 11e abuts against the metallic member 6C. The pressing elements 11a-11d are connected to an upper end portion of the body portion 11e, and are separated from one another. A screw 11f is formed on a periphery surface of the body portion 11e.

A pressing member 12 is attached around an outer side of the heat-insulating member 11 by means of a screw 12a. The pressing member 12 has a cylindrical shape. An upper end portion 12b of the pressing member 12 presses each of the pressing elements 11a–11d from outside. While the screws 11f and 12a are engaged with each other, the pressing member 12 is turned to move the pressing member upwardly, so that a pressure from the upper end portion 12b as shown by an arrow B increases and each of the pressing elements is strongly pressed inwardly.

In the above embodiment, the supporting member is urged against the supporting projection by pressing the pressing elements (leaf springs) from outside. However, other pressing means such as coil springs may be used.

The height of the supporting member may be adjusted in such a way that a concave portion is provided on the wall of the chamber, and a female screw and a male screw are formed on the concave portion and a lower periphery surface of the supporting member, respectively, to engage the female screw of the chamber side with the male screw of the supporting member side.

Figure 7:
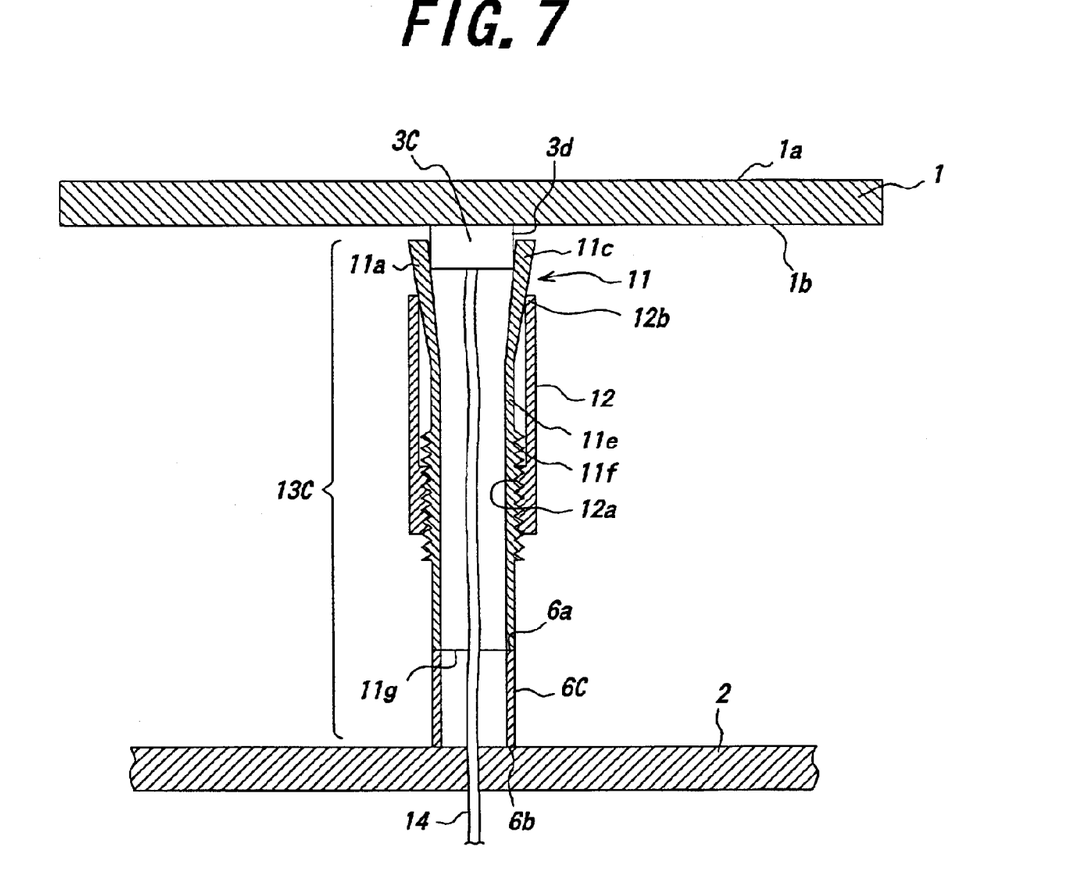
FIG. 7 is a cross sectional view schematically showing a supporting structure according to a still another embodiment of the present invention.
Figure 8:
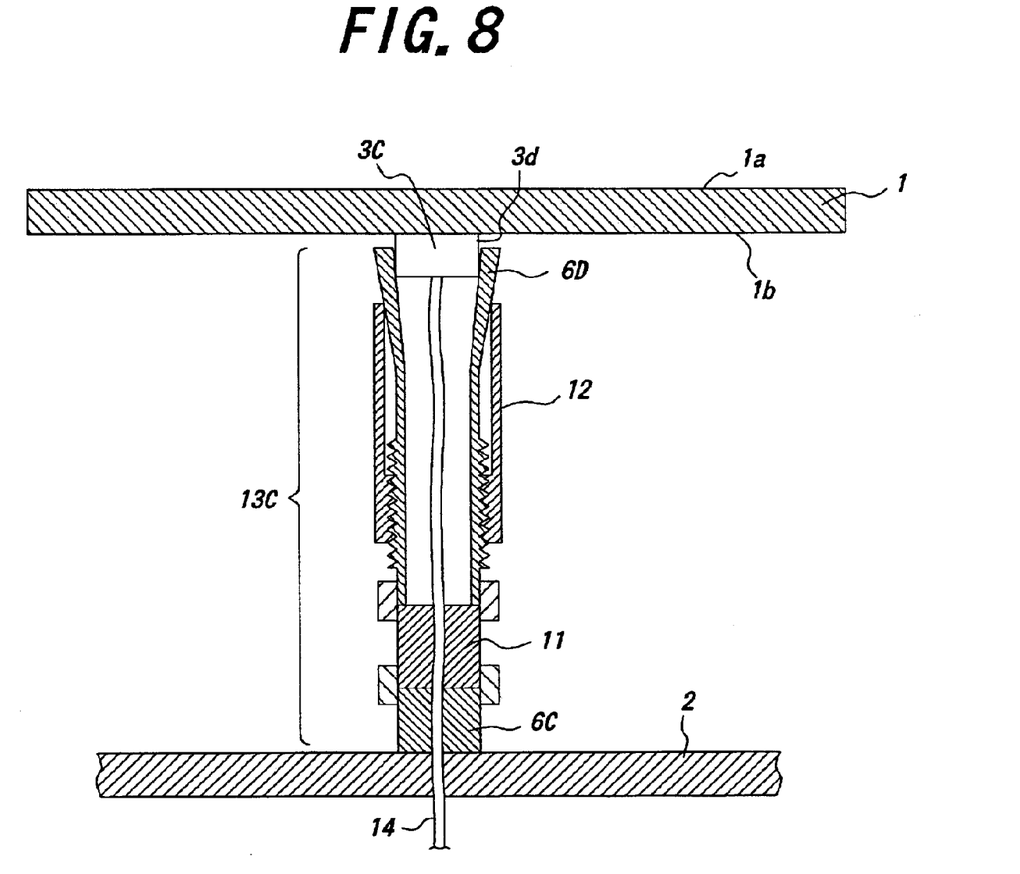
FIG. 8 is a cross sectional view schematically showing a supporting structure according to a still further embodiment of the present invention.

In a embodiment shown in FIGS. 6(a) and 6(b), a susceptor to be heated by an external heat source is illustrated, but, as shown in FIG. 7, a bundle of wires 14 composed of wires for supplying electric power to a heater (not shown) embedded in the susceptor and wires of a thermocouple for measuring the temperature of the susceptor 1 may run through the inner space of the heat-insulating member 11 and the metallic member 6C. In this case where the susceptor 1 is heated by the heater embedded in the susceptor, the supporting structure according to the present invention is effective, since a sudden difference in temperature between the supporting member 13 and the susceptor 1 occurs. Further, the supporting member 13 may also be composed of a metallic member 6D, a heat-insulating member 11 and a metallic member 6C, as shown in FIG. 8. In this embodiment, the supporting member 13C also has the same configuration as that shown in FIG. 6 except the material.

As having been described in the above, according to the present invention, an amount of heat escaping from the ceramic susceptor to the chamber through the supporting member during the heating can be decreased. Thus, a thermal stress at the joining portion between the ceramic susceptor and the supporting member can be reduced, thereby preventing the joining portion form being strained, misaligned and broken. In addition, although the ceramic susceptor is mechanically fixed, a fixing member (mainly a metallic material) is not exposed on the setting surface for placing an article to be processed.

While the preferred embodiments of the present invention have been described, it is to be understood that modifications and variations may be made without departing from the sprit of the invention. The scope of the invention, therefore, is to be determined only by the following claims.

What is claimed is:

1. A supporting structure for attaching a ceramic susceptor in a processing chamber, said ceramic susceptor having a setting face for placing an article to be processed and being subjected to temperature changes, said supporting structure comprising:

a supporting projection integrally provided on a surface of said susceptor opposed to said setting face of said susceptor;

a heat-insulating member surrounding at least a portion of said supporting projection and being separated from said supporting projection; and a metallic member connected to said heat-insulating member and being attached to said processing chamber, wherein said supporting projection is attached to said heat-insulating member by mechanical means, and said metallic member and said supporting projection are not directly attached to one another, and a central axis of said heat-insulating member is substantially linearly aligned with a central axis of said metallic member.

2. The supporting structure according to claim 1, wherein said heat-insulating member and said metallic member each have a tubular shape.

3. The supporting structure according to claim 2, wherein each of said supporting projection and said heat-insulating member has a through-hole and said mechanical means is an engaging member inserted into the through-holes of said supporting projection and said heat-insulating member.

4. The supporting structure according to claim 2, wherein said mechanical means is a holding member for holding an outer surface of each of said supporting projection and said heat-insulating member from outside thereof.

5. The supporting structure according to claim 2, wherein said mechanical means is a pressing member for pressing said heat-insulating member against said supporting projection to fix said supporting projection to said heat-insulating member.

6. The supporting structure according to claim 1, wherein each of said supporting projection and said heat-insulating member have through-holes that are aligned with one another, and said mechanical means is an engaging member inserted into the aligned through-holes of said supporting projection and said heat-insulating member.

7. The supporting structure according to claim 1, wherein said mechanical means is a holding member for holding an outer surface of each of said supporting projection and said heat-insulating member from outside thereof.

8. The supporting structure according to claim 1, wherein said mechanical means is a pressing member for pressing said heat-insulating member against said supporting projection to fix said supporting projection to said heat-insulating member.

* * * * *